United States Patent [19]
Lien

[11] Patent Number: 5,989,991
[45] Date of Patent: Nov. 23, 1999

[54] METHODS FOR FABRICATING A BONDING PAD HAVING IMPROVED ADHESION TO AN UNDERLYING STRUCTURE

[75] Inventor: Chuen-Der Lien, Los Altos Hills, Calif.

[73] Assignee: Integrated Device Technology, Inc., Santa Clara, Calif.

[21] Appl. No.: 08/879,562

[22] Filed: Jun. 20, 1997

Related U.S. Application Data

[62] Division of application No. 08/409,784, Mar. 24, 1995, Pat. No. 5,723,822.

[51] Int. Cl.$^6$ .................................................... H01L 21/44
[52] U.S. Cl. ........................................... 438/612; 438/613
[58] Field of Search ...................................... 438/612, 613

[56] References Cited

U.S. PATENT DOCUMENTS

| | | |
|---|---|---|
| 5,045,918 | 9/1991 | Cagan et al. . |
| 5,124,781 | 6/1992 | Tashiro . |
| 5,394,013 | 2/1995 | Oku et al. . |
| 5,403,777 | 4/1995 | Bryant et al. ............................ 438/612 |
| 5,436,197 | 7/1995 | Hause ...................................... 438/612 |
| 5,565,378 | 10/1996 | Harada et al. ........................... 438/612 |
| 5,587,337 | 12/1996 | Idaka et al. .............................. 438/613 |
| 5,661,081 | 8/1997 | Hsue et al. ............................... 438/612 |

Primary Examiner—Kevin M. Picardat
Assistant Examiner—Deven Collins
Attorney, Agent, or Firm—Bever & Hoffman

[57] ABSTRACT

An insulating layer having an irregular upper surface is provided to improve the adhesion and increase the coefficient of friction between the insulating layer and a bonding pad formed over the insulating layer. By making the upper surface of the insulating layer irregular, the area of contact between the bonding pad and the insulating layer is increased. As a result, the adhesion between the bonding pad and the insulating layer is also increased. This prevents the bonding pad from being detached from the insulating layer when a bonding wire is later attached to the bonding pad. The upper surface of the insulating layer can be made irregular by etching one or more cavities in the upper surface of the insulating layer. The upper surface of the insulating layer can alternatively be made irregular by forming one or more raised structures beneath the insulating layer. The raised structures cause plateaus to be formed at the upper surface of the insulating layer.

6 Claims, 8 Drawing Sheets

METHODS FOR FABRICATING A BONDING PAD HAVING IMPROVED ADHESION TO AN UNDERLYING STRUCTURE

This application is a division of application Ser. No. 08/409,784, filed Mar. 24, 1995, U.S. Pat. No. 5,723,822.

BACKGROUND OF THE INVENTION

1. Field of the Invention

The present invention relates to a structure and method for improving the adhesion between a bonding pad, and a surface of an integrated circuit (IC).

2. Description of Related Art

FIG. 1 is a cross sectional diagram of a portion of prior art integrated circuit 100. Integrated circuit 100 includes a lightly doped p type silicon semiconductor substrate 101, doped semiconductor regions 102 and 103, gate oxide layer 104, polysilicon gate 105, insulating layers 106–108, passivation layer 109, metal layers 110–112, and bonding wire 114.

Semiconductor devices are formed along the upper surface of substrate 101 using fabrication techniques known in the art. For example, n type regions 102 and 103, gate oxide 104 and polysilicon gate 105 form a conventional n-channel MOS transistor. Gate oxide layer 104 is also formed along the upper surface of substrate 101. Polysilicon gate 105 is then formed by etching a polysilicon layer (not shown) which is formed over gate oxide layer 104.

Insulating layers 106–108 are alternately formed with metal layers 110–112 to form a multi-layer interconnect structure. Openings are formed in insulating layers 104 and 106–108 to allow portions of metal layers 110–112 to extend through insulating layers 104 and 106–108. Metal layers 110–112 variously interconnect the silicon regions. In the plane of FIG. 1., metal layers 110, 111 and 112 provide an electrical connection to n type region 102, metal layers 110 and 111 provide an electrical connection to n type region 102, and metal layer 110 provides an electrical connection to polysilicon gate 105.

Metal layer 112 includes metal bonding pad 116 and integral electrical connector 117 simultaneously formed on insulating layer 108. Metal bonding pad 116 and electrical connector 117 are typically aluminum or an aluminum alloy. In general, bonding pad 116 is formed near an edge of integrated circuit 100. Electrical connector 117 travels from bonding pad 116 along the upper surface of insulating layer 108 to the opening which extends through insulating layer 108. Passivation layer 109 is formed over metal layer 112. Opening 115 in metal layer 112 is formed to allow bonding wire 114 to be connected to bonding pad 116.

FIG. 2 is a top view of integrated circuit 100 which illustrates passivation layer 109, metal layer 112 (in dashed lines), and bonding wire 114. The other layers of integrated circuit 100 are not shown in FIG. 2. Bonding wire 114 provides an electrical connection between integrated circuit 100 and its external pins (not shown).

Methods for attaching bonding wire 114 to bonding pad 116 include conventional ultrasonic, thermosonic and thermocompression techniques. These techniques typically result in ball bond 113 being formed at the interface between bonding wire 114 and bonding pad 116. These techniques can also result in thermal and mechanical stresses within bonding pad 116. The stresses can cause the bonding pad 116 to become detached from insulating layer 108 and/or electrical connector 117. When this happens, integrated circuit 100 can be rendered non-functional. It would therefore be desirable to have a structure which provides increased adhesion and friction between bonding pad 116 and underlying insulating layer 108. It would also be desirable to have a simple and inexpensive method to provide this increased adhesion.

SUMMARY OF THE INVENTION

In accordance with one embodiment of the present invention, an integrated circuit structure includes an electrically insulating layer situated over a semiconductor substrate. One or more interconnect layers and additional electrically insulating layers can exist between this insulating layer and the substrate. The insulating layer has one or more cavities which extend into the insulating layer from the upper surface of the insulating layer. An electrically conductive bonding pad is situated over the upper surface of the insulating layer, such that the bonding pad is located at least partially within the cavities.

The cavities can have various shapes, including, but not limited to, square, rectangular or circular. The cavities can be spaced in a regular or irregular manner.

In another embodiment of the invention, the integrated circuit structure includes a first electrically insulating layer situated over a semiconductor substrate. One or more raised structures are situated over the upper surface of the first insulating layer. A second electrically insulating layer is situated over the first insulating layer and the raised structures, such that the upper surface of the second insulating layer exhibits a plateau or peak where the second insulating layer overlies a raised structure. An electrically conductive bonding pad is situated over the second insulating layer at a location such that the electrically conductive bonding pad substantially overlies the raised structures.

The raised structures can have various shapes, including, but not limited to, square, rectangular or circular. The raised structures can be spaced in a regular or irregular manner on the surface of the first insulating layer. The dimensions of the raised structures and the thickness of the second insulating layer are controlled such that plateaus or peaks are formed along the upper surface of the second insulating layer. The plateaus can have various shapes, which are substantially defined by the shapes of the underlying raised structures.

The above described embodiments provide an increased area of contact between the bonding pad and the underlying insulating layer. As a result, the adhesion forces and the coefficient of friction between the bonding pad and the insulating layer are increased. This increased adhesion prevents separation of the bonding pad from the insulating layer when a bonding wire is attached to the bonding pad.

Another embodiment of the invention includes a method of attaching a bonding pad to an integrated circuit chip. This method includes the steps of (1) forming an electrically insulating layer over a semiconductor substrate, (2) creating one or more cavities in an upper surface of the insulating layer, and (3) providing electrically conductive material over the upper surface of the insulating layer to form the bonding pad, wherein part of the electrically conductive material is provided in each of the cavities.

Another method in accordance with the present invention includes the steps of (1) forming a first insulating layer over a semiconductor substrate, (2) creating one or more raised structures over the upper surface of the first insulating layer, (3) providing a second insulating layer over the first insulating layer and the raised structures, whereby the raised structures cause the upper surface of the second insulating layer to exhibit peaks where the second insulating layer overlies the raised structures, and (4) providing an electrically conductive material over upper surface of the second insulating layer at a location which overlies the raised structures, wherein the electrically conductive material forms the bonding pad. The present invention provides a low cost technique to improve adhesion between the bonding pad and the underlying insulating layer.

DETAILED DESCRIPTION OF THE INVENTION

Figure 1:
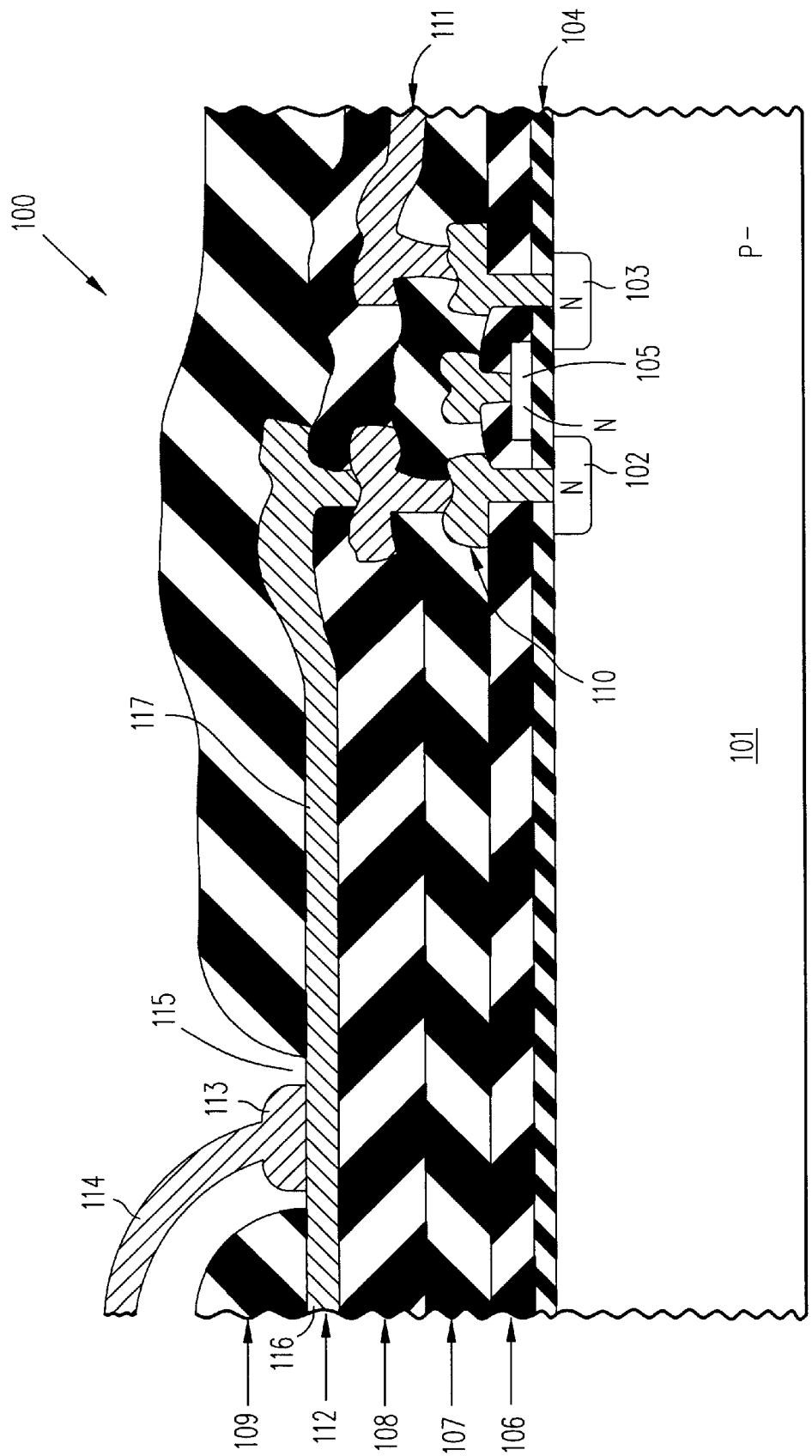
FIG. 1 is a cross sectional view of a bonding pad region of a prior art integrated circuit.
Figure 2:
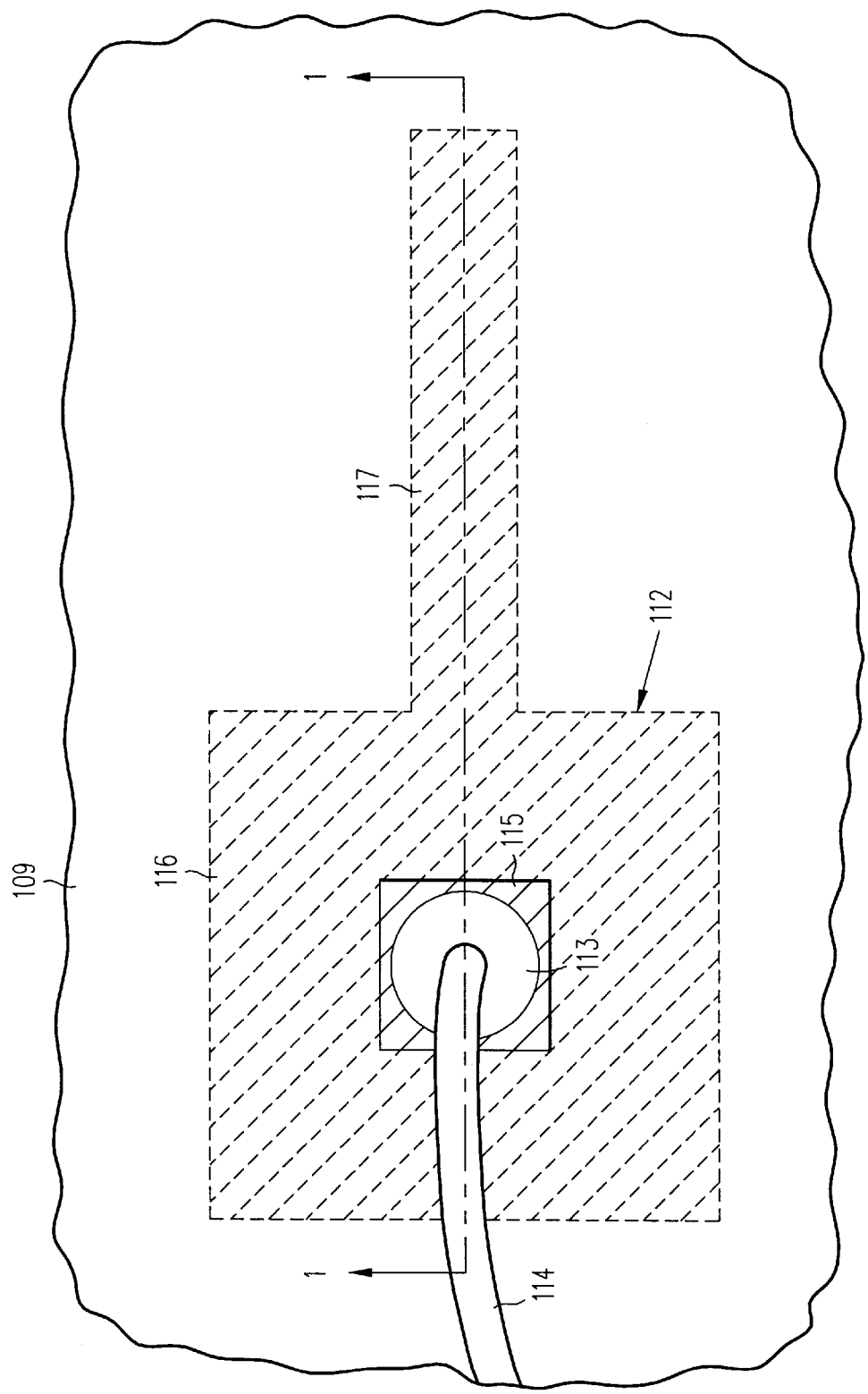
FIG. 2 is a top view of the bonding pad region of FIG. 1, and the cross section of FIG. 1 is taken through plane 1—1 in FIG. 2.
Figure 3:
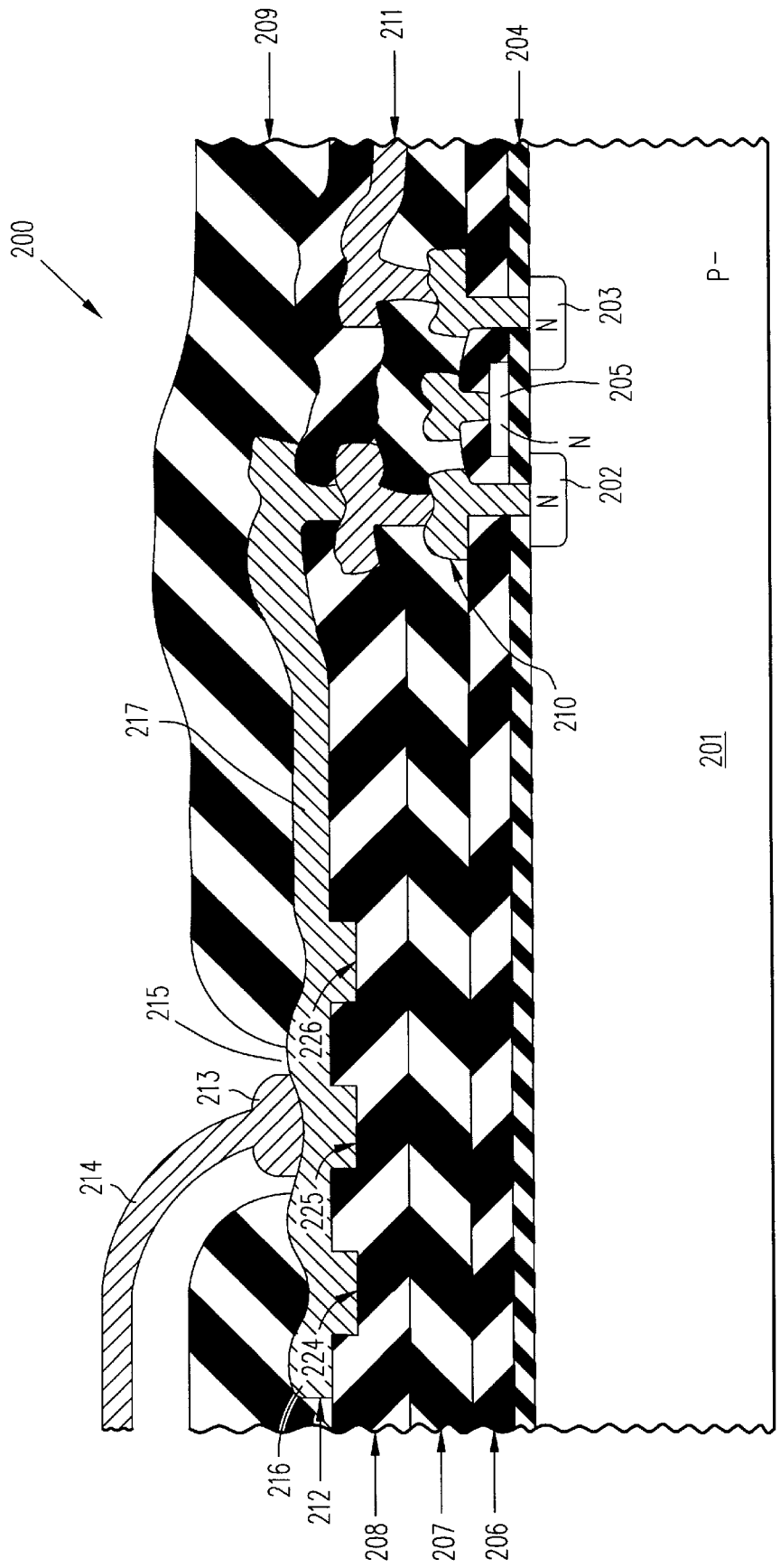
FIG. 3 is a cross sectional view of a bonding pad region of an integrated circuit in accordance with the invention.

FIG. 3 illustrates a bonding pad region of integrated circuit 200 which includes a semiconductor substrate 201, doped semiconductor regions 202 and 203 formed in substrate 201, gate oxide layer 204 located over the upper surface of semiconductor substrate 201, and polysilicon gate 205 located over gate oxide layer 204. Integrated circuit 200 also includes insulating layer 206 located over gate oxide layer 204 and polysilicon gate 205. First-level metal layer 210 is located over insulating layer 206, insulating layer 207 is located over first-level metal layer 210, and second-level metal layer 211 is located over insulating layer 207. Insulating layer 208 is located over second-level metal layer 211. Third-level metal layer 212 is located over insulating layer 208. Passivation layer 209 is located over third-level metal layer 212. Bonding wire 214 connects to third-level metal layer 212 through opening 215 in passivation layer 209. In other embodiments, other numbers of polysilicon layers and metal layers can be used.

Although FIG. 3 illustrates a three-level interconnect system, the present invention applies to interconnect systems having different numbers of levels. Various circuit elements are fabricated over the upper surface of substrate 201 in accordance with conventional semiconductor fabrication techniques. For example, doped regions 202–203, gate oxide layer 204 and polysilicon gate 205 form an n-channel MOS transistor.

Cavities 224–226 are located at the upper surface of insulating layer 208. Third-level metal layer 212 is formed over the upper surface of insulating layer 208 such that this metal layer 212 extends into cavities 224–226.

Figure 4:
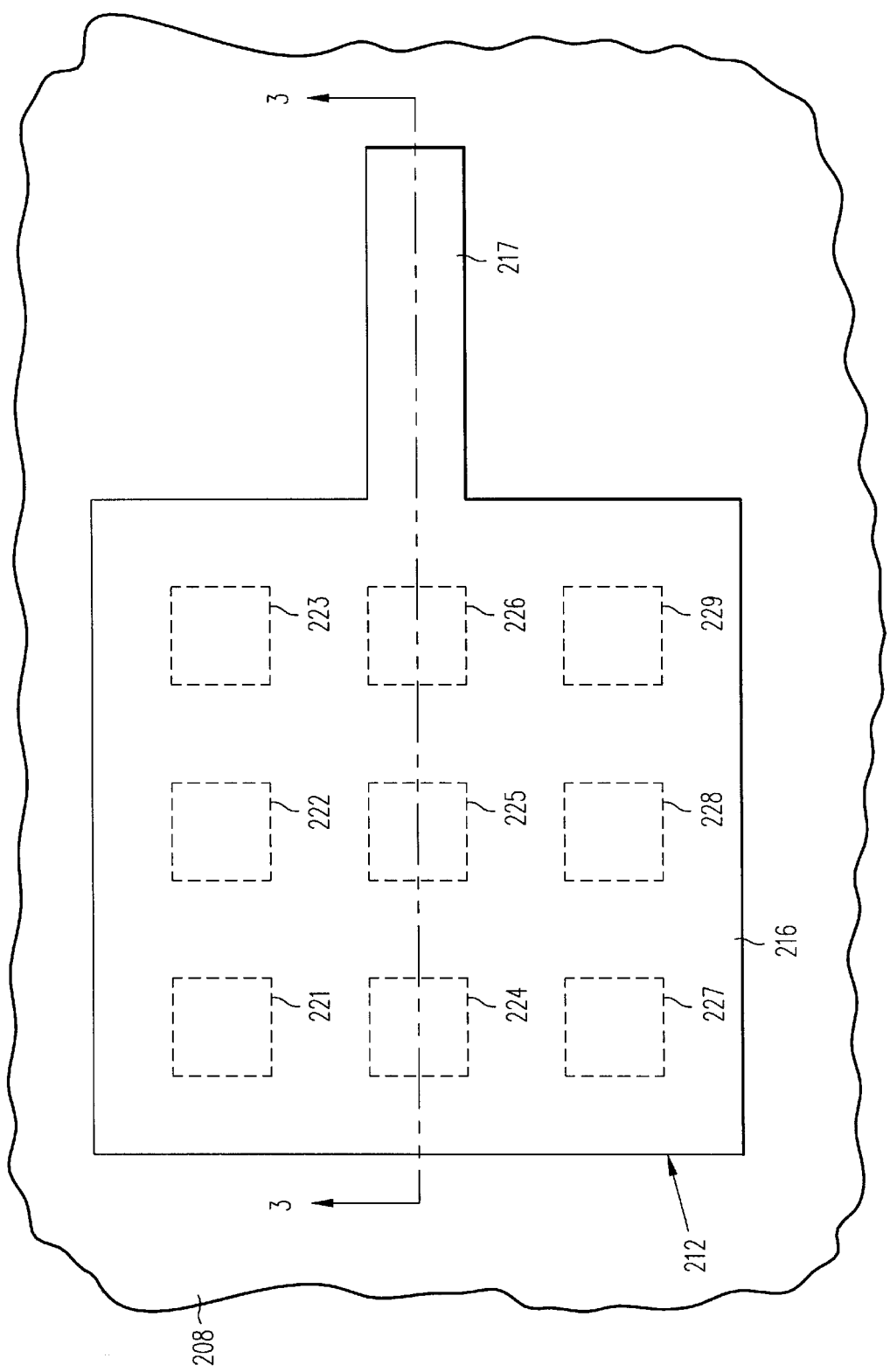
FIG. 4 is a top view of the bonding pad region illustrated FIG. 3, and the cross section of FIG. 3 is taken through plane 3—3 in FIG. 4.

FIG. 4 is a top view of the bonding pad region of integrated circuit 200 illustrated in FIG. 3, including insulating layer 208 and third-level metal layer 212. Passivation layer 209 and bonding wire 214 are not illustrated in FIG. 4 for purposes of clarity. Third-level metal layer 212 is shaped to form bonding pad 216 and electrical connector 217. Cavities 221–229, which are formed in insulating layer 208 and located beneath bonding pad 216, are shown with dashed lines. Cavities 221–229 are depicted as square cavities. However, these cavities can be formed using any shape, including, but not limited to, circular, rectangular, triangular, or hexagonal. These cavities can also be regularly or irregularly spaced in the upper surface of insulating layer 208. Additionally, other numbers of cavities can be used. For example, in a particular embodiment, a ten by ten grid of cavities can be formed in the upper surface of insulating layer 208.

Figure 5A:
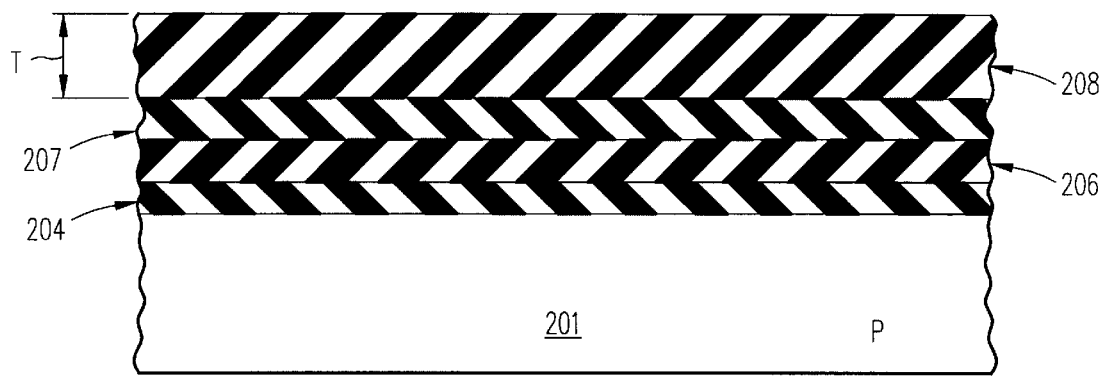
FIGS. 5a–5c are cross sectional views illustrating the fabrication of the bonding pad region of FIG. 3.
Figure 5B:
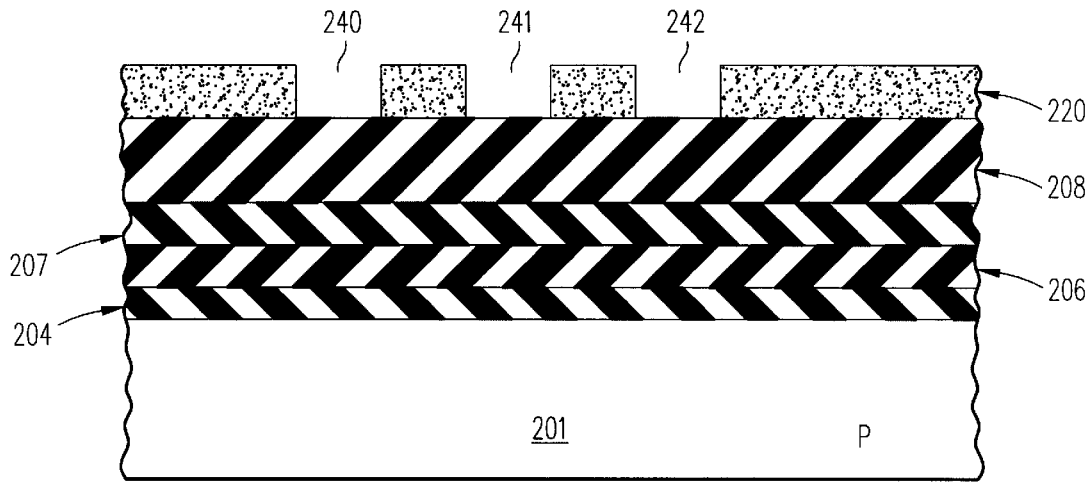
Figure 5C:
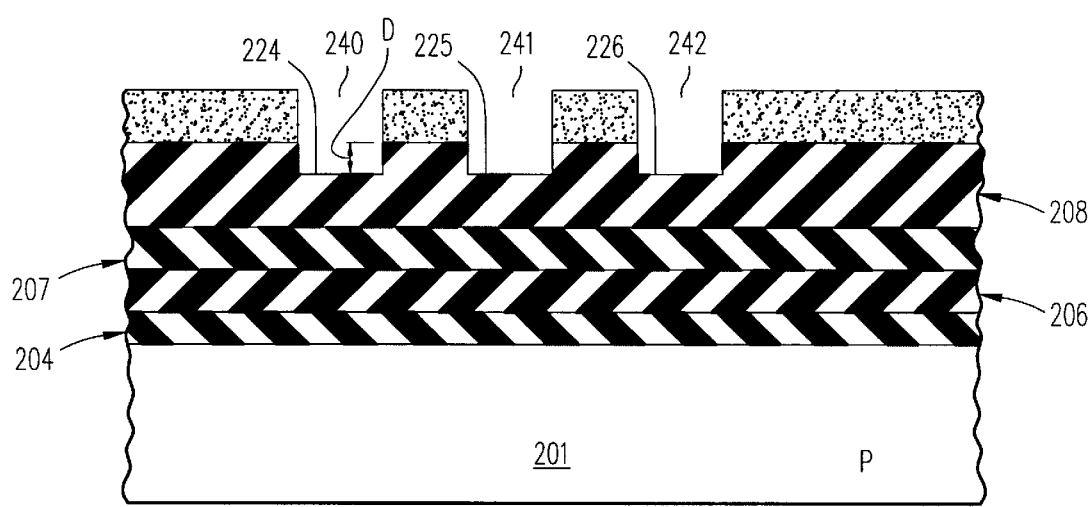

FIGS. 5a–5c illustrate a method of fabricating integrated circuit 200. These figures only illustrate the portion of integrated circuit 200 immediately adjacent to bonding pad 216. Referring to FIG. 5a, gate oxide layer 204, insulating layers 206–208 and the unshown intermediate layers are fabricated over the upper surface of semiconductor substrate 201 in accordance with conventional semiconductor processing techniques. Semiconductor substrate 201 is typically monocrystalline silicon. Although semiconductor substrate 201 is illustrated as p type material, substrate 201 can also be n type material. In one embodiment, insulating layer 208 has a thickness T of approximately 1 $\mu$m.

As depicted in FIG. 5b, a photoresist layer 220 is formed over the upper surface of insulating layer 208. A reticle (not shown), which defines the locations of openings 240–242 in photoresist layer 220, is placed over photoresist layer 220. Photoresist layer 220 is exposed and developed to create openings 240–242 in photoresist layer 220.

As illustrated in FIG. 5c, a controlled etch is then performed through photoresist layer 220, thereby forming cavities 224–226 in the upper surface of insulating layer 208. In one embodiment, cavities 224–226 are square cavities having a depth D in the range of 0.1 to 1 $\mu$m, lengths L in the range of 0.1 to 5 $\mu$m, and lateral spacing S of approximately 5 $\mu$m. In a particular embodiment, cavities 224–226 have a depth D of approximately 0.3 $\mu$m, lengths L of approximately 5 $\mu$m and lateral spacing S of approximately 5 $\mu$m. The controlled etch is, for example, a wet etch (e.g., a buffered oxide etch) or a fluorine plasma etch (using, e.g., $SF_4$ or $CF_4$). By controlling the etch, cavities 224–226 extend only partially through insulating layer 208. The depth of cavities 224–226 is controlled such that bonding pad 216 is vertically separated from substrate 201.

Photoresist layer 220 is then removed. A blanket metal layer (not shown) is formed over the upper surface of insulating layer 208 using a conventional technique such as evaporation or sputtering. The dimensions of cavities 224–226 are selected to ensure that the blanket metal layer is deposited into these cavities. A metal mask (not shown) which defines the boundaries of the third-level metal layer 212 (including the boundaries of bonding pad 216 and electrical connector 217) is provided over the blanket metal layer and an etching step is performed, thereby creating bonding pad 216 and electrical connector 216.

Cavities 224–226 increase the effective contact area between bonding pad 216 and insulating layer 208. This increased contact area increases the adhesion forces between bonding pad 216 and insulating layer 208. In addition, the coefficient of friction between bonding pad 216 and insulating layer 208 is increased by the irregular shape of the interface between these two elements. As a result, it is more difficult for bonding pad 215 to move with respect to insulating layer 208.

Third-level metal layer 212, and therefore bonding pad 216, is formed of a metal or a metal alloy. Third-level metal layer 212 can include a single layer or multiple layers. For example, third-level metal layer 212 can include: (1) layers of an aluminum alloy and titanium-tungsten, (2) layers of an aluminum alloy and titanium nitride, (3) layers of an aluminum alloy, titanium nitride and titanium, or (4) layers of an aluminum alloy and titanium. In general, the aluminum alloy includes 0 to 2% silicon by weight and 0 to 4% copper by weight. In a particular embodiment, the aluminum alloy includes 1% silicon by weight and 0.5% copper by weight.

Bonding wire 214 is typically gold or aluminum. Bonding wire 214 can be attached to bonding pad 216 using conventional ultrasonic, thermosonic or thermocompression techniques. The end of bonding wire 214 which contacts bonding pad 216 typically forms a ball connection 215. The completed bonding pad structure is illustrated in FIG. 3.

Figure 6:
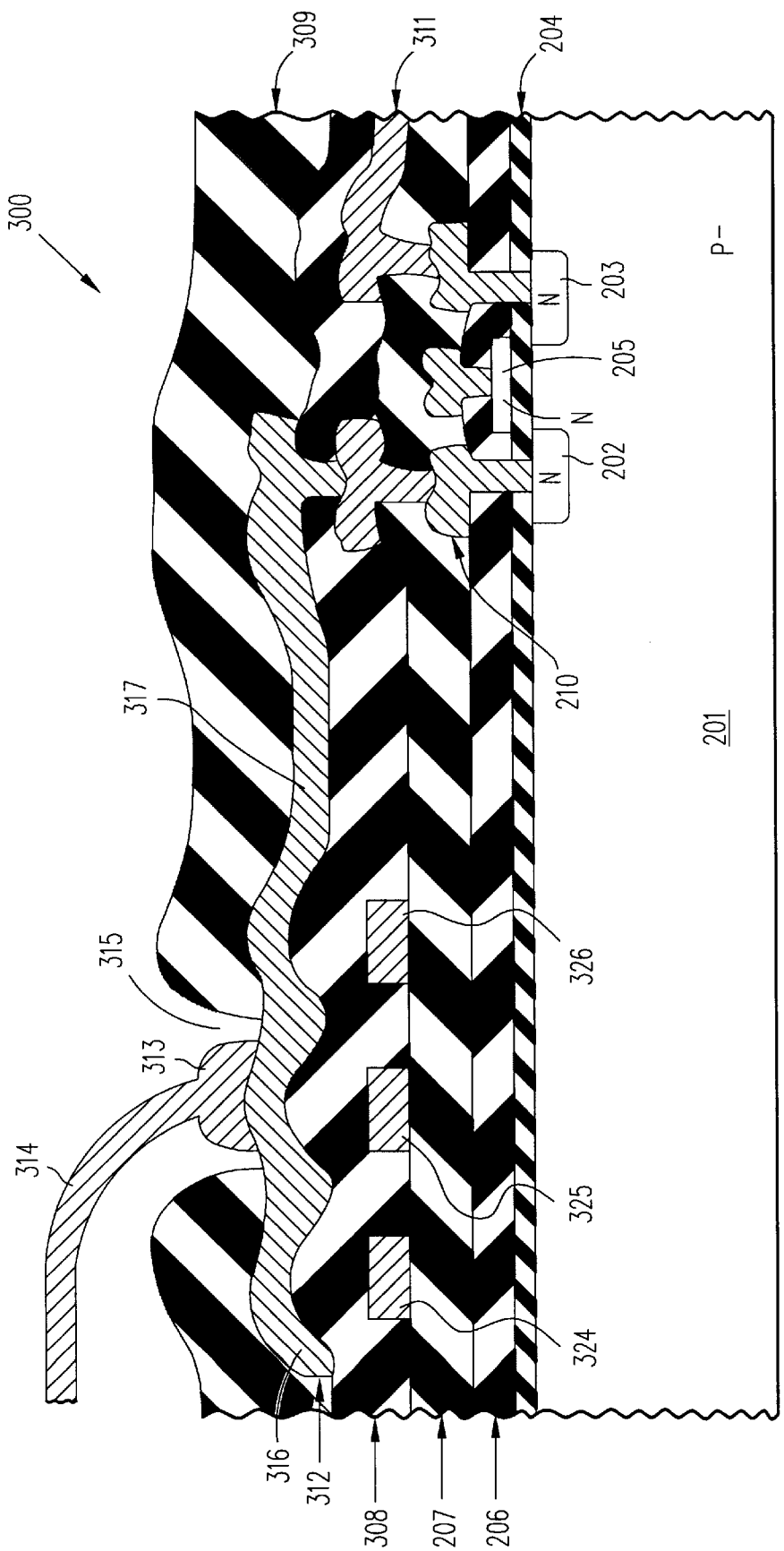
FIG. 6 is a cross sectional view of a bonding pad region of an integrated circuit in accordance with another embodiment of the invention.

FIG. 6 illustrates a bonding pad region of an integrated circuit 300 according to another embodiment of the invention. Integrated circuit 300 includes elements 201–207 and 210 previously described in connection with integrated circuit 200. Integrated circuit 300 also contains second-level metal layer 311, which includes raised structures 324–326 located over insulating layer 207. Insulating layer 308 is located over second-level metal layer 311, third-level metal layer 312 is located over insulating layer 308, and passivation layer 309 is located over third-level metal layer 312. Bonding wire 314 connects to third-level metal layer 312 through opening 315 in passivation layer 309.

Figure 7:
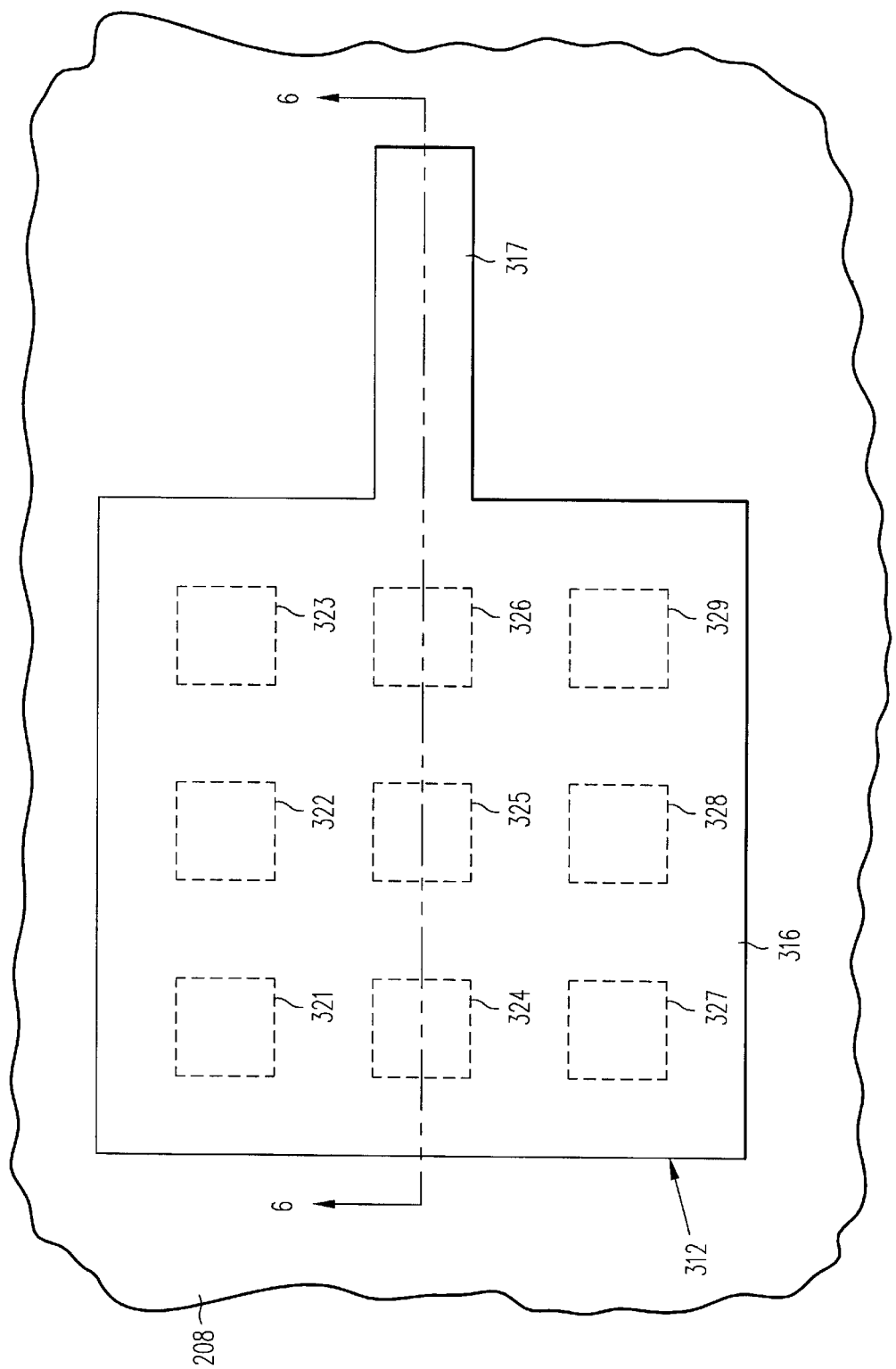
FIG. 7 is a top view of the bonding pad region illustrated in FIG. 6, and the cross section of FIG. 6 is taken through plane 6—6 in FIG. 7.

FIG. 7 is a top view of the bonding pad region of integrated circuit 300, including third-level metal layer 312 and insulating layer 308. Third-level metal layer 312 includes bonding pad 316 and electrical connector 317. Raised structures 321–329 of second-level metal layer 311 which are located under insulating layer 308 are illustrated in dashed lines. Although raised structures 321–329 are illustrated as squares, other shapes are within the scope of the invention. Raised structures 321–329 are typically metal. Alternatively, raised structures 321–329 can be made of polysilicon or other suitable materials. Raised structures 321–329 can be regularly or irregularly spaced. In other embodiments, other numbers of raised structures are used. In a particular embodiment, a ten by ten grid of raised structures is formed on the upper surface of insulating layer 207.

Figure 8A:
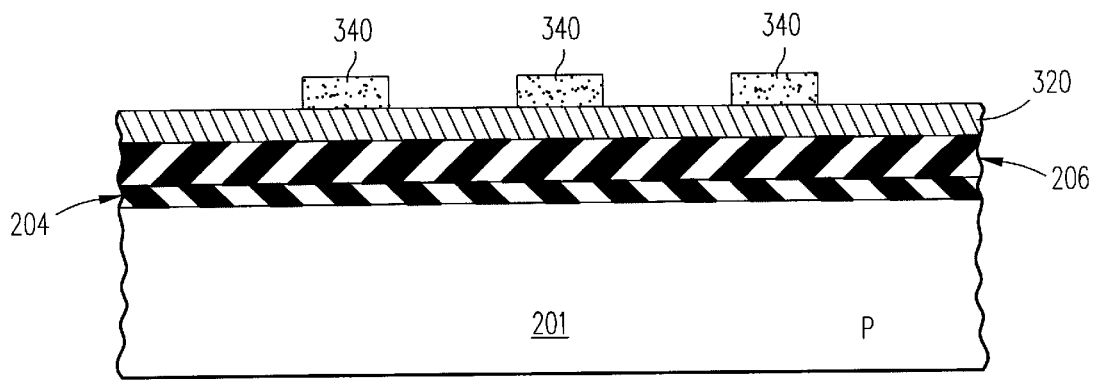
FIGS. 8a–8c are cross sectional views illustrating the fabrication of the bonding pad region of FIG. 6.
Figure 8B:
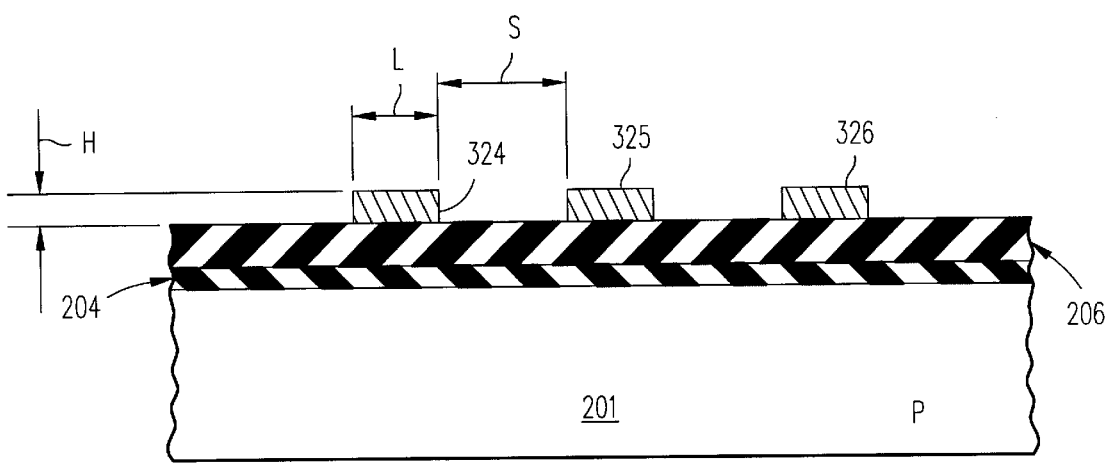
Figure 8C:
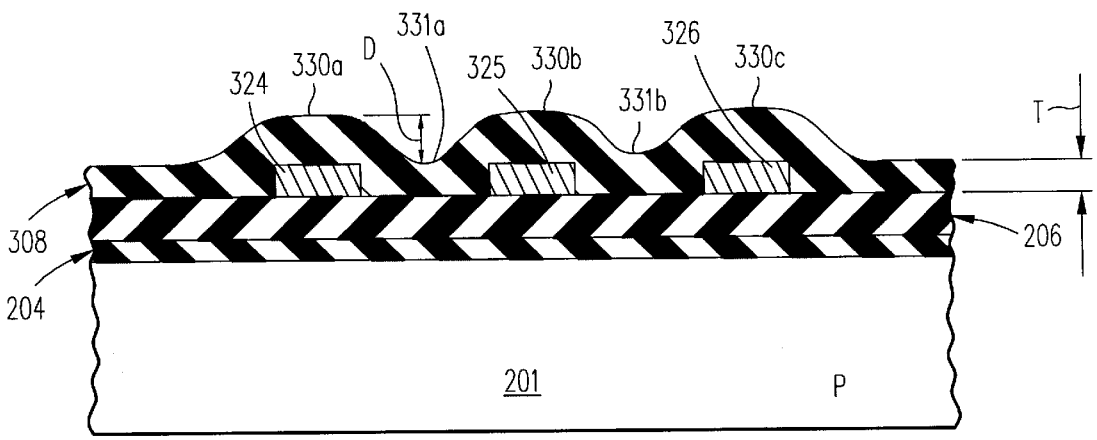

FIGS. 8a–8c illustrate a method of fabricating the bonding pad region of integrated circuit 300 shown in FIG. 6. FIGS. 8a–8c only illustrate the portion of integrated circuit 300 immediately adjacent to bonding pad 316. Referring to FIG. 8a, gate oxide layer 204, insulating layer 206, and the unshown intermediate layers are fabricated over the upper surface of semiconductor substrate 201 in accordance with conventional semiconductor processing techniques.

Second-level metal layer 311 is formed by depositing a blanket metal layer 320 over insulating layer 206. A photoresist mask 340 which defines raised structures 324–326 is then formed over blanket metal layer 320 and an etch is performed, thereby leaving raised structures 324–326 as illustrated in FIG. 8b. Square raised structures 324–326 have a height H in the range of 0.1 to 1.0 $\mu$m and a length L in the range of approximately 1 to 3 $\mu$m. The lateral spacing S between raised structures (e.g., raised structures 324 and 325) is in the range of 7 to 8 $\mu$m. These heights, lengths and spacings are selected to provide the desired topography at the upper surface of subsequently deposited insulating layer 308.

Insulating layer 308 is then deposited over raised structures 324–326 as shown in FIG. 8c. Insulating layer 308 can be $SiO_2$, BSG, PSG, BPSG or $Si_3N_4$ or another deposited dielectric. The thickness T of insulating layer 308 is selected such that the upper surface of insulating layer 308 has the desired irregular topography when deposited over raised structures 324–326 and insulating layer 206. In FIG. 8b, the irregular topography includes plateaus (or peaks) 330a–330c and valleys 331a–331b. The depth D of valleys 331a–331b relative to plateaus 330a–330c is in the range of 0.1 to 1.0 $\mu$m.

Third-level metal layer 312 and passivation layer 309 are then formed in substantially the same manner as third-level metal layer 212 and passivation layer 209 (FIG. 3). Bonding wire 314 is connected to bonding pad 316 through opening 315 in the same manner previously described in connection with bonding wire 214 (FIG. 3).

Although the present invention has been described in connection with particular embodiments, variations of these embodiments would be apparent to one of ordinary skill in the art. For example, a single cavity or a single raised structure could be used to create the irregular upper surface of the insulating layer situated directly below the bonding pad. Layer 210, 211, or 311 could consist of doped polysilicon. Thus, the present invention is only intended to be limited by the following claims.

I claim:

1. A method of attaching a bonding pad to an integrated circuit chip, said method comprising the steps of:

forming a first electrically insulating layer over a semiconductor substrate;

creating one or more cavities in an upper surface of the first insulating layer, the one or more cavities extending into the first insulating layer from an upper surface of the first insulating layer to increase an exposed surface area of the first insulating layer; and providing electrically conductive material over the upper surface of the first insulating layer to form the bonding pad, wherein the electrically conductive material is provided in each cavity.

2. The method of claim 1, further comprising the step of forming one or more electrically insulating layers and one or more interconnect layers between the substrate and the first insulating layer.

3. The method of claim 1, wherein the creating step comprises the steps of:

providing a mask over the first insulating layer, the mask having one or more mask openings; and etching the first insulating layer through the one or more mask openings.

4. A method of attaching a bonding pad to an integrated circuit chip, the method comprising the steps of:

forming a first electrically insulating layer over a semiconductor substrate;

creating one or more raised structures over an upper surface of the first insulating layer;

providing a second electrically insulating layer over the first insulating layer and the raised structures, whereby the raised structures cause the upper surface of the second insulating layer to exhibit peaks where the second insulating layer overlies the raised structures; and providing electrically conductive material over the upper surface of the second insulating layer at a location which overlies the raised structures, wherein the electrically conductive material forms the bonding pad.

5. The method of claim 4, further comprising the step of forming one or more electrically insulating layers and one or more interconnect layers between the substrate and the first insulating layer.

6. The method of claim 4, wherein the creating step comprises the steps of:

providing a layer of material over the upper surface of the first insulating layer, providing a mask over the layer of material, wherein the mask defines the location of each of the raised structures; and etching the layer of material through the mask, thereby creating the raised structures.

* * * * *